United States Patent
Hsiao et al.

(10) Patent No.: US 8,482,687 B2
(45) Date of Patent: Jul. 9, 2013

(54) LIQUID CRYSTAL DISPLAY DEVICE

(71) Applicant: AU Optronics Corp., Hsin-Chu (TW)

(72) Inventors: Chia-Chiang Hsiao, Hsin-Chu (TW);
Chih-Wen Chen, Hsin-Chu (TW);
Li-Chih Hsu, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 13/723,945

(22) Filed: Dec. 21, 2012

(65) Prior Publication Data

US 2013/0120681 A1    May 16, 2013

Related U.S. Application Data

(62) Division of application No. 12/684,911, filed on Jan. 9, 2010, now Pat. No. 8,368,827.

(30) Foreign Application Priority Data

May 20, 2009 (TW) ............................... 98116779 A

(51) Int. Cl.
*G02F 1/1343* (2006.01)
(52) U.S. Cl.
USPC ............................. 349/38; 349/141; 349/144

(58) Field of Classification Search
None
See application file for complete search history.

(56) References Cited

U.S. PATENT DOCUMENTS

| | | | |
|---|---|---|---|
| 2005/0253797 A1 | 11/2005 | Kamada et al. | |
| 2005/0286003 A1 | 12/2005 | Lee et al. | |
| 2007/0064164 A1 | 3/2007 | Tasaka et al. | |

FOREIGN PATENT DOCUMENTS

| | | |
|---|---|---|
| TW | 1282541 | 6/2007 |
| TW | 200735025 A | 9/2007 |
| TW | 200805228 A | 1/2008 |
| TW | 200835991 A | 9/2008 |

*Primary Examiner* — Lucy Chien
(74) *Attorney, Agent, or Firm* — WPAT, PC; Justin King

(57) ABSTRACT

An exemplary liquid crystal display device includes a data line, a pixel, a first gate line, a second gate line, an additional electrode and an additional gate line. The pixel includes a first sub-pixel and a second sub-pixel. The first gate line is electrically coupled to the first sub-pixel. The second gate line is electrically coupled to the second sub-pixel. The first sub-pixel is electrically coupled to the data line to receive a signal provided from the data line. The second sub-pixel is electrically coupled to the first sub-pixel through the additional electrode and to receive a signal provided from the data line through the first sub-pixel. The additional gate line is arranged crossing over the additional electrode and whereby a compensation capacitance is formed between the additional gate line and the additional electrode.

7 Claims, 6 Drawing Sheets

LIQUID CRYSTAL DISPLAY DEVICE

CROSS-REFERENCE TO RELATED APPLICATIONS

This application is a divisional application of and claims priority benefit of application Ser. No. 12/684,911, filed on Jan. 9, 2010, now pending, which is based upon and claims the benefit of priority from the prior Taiwanese Patent Application No. 098116779, filed May 20, 2009, the entire contents of which are incorporated herein by reference.

FIELD OF THE INVENTION

The present invention generally relates to display technology fields and, particularly to a liquid crystal display device could improve color washout at large viewing angle.

BACKGROUND OF THE INVENTION

Nowadays, a vertical Alignment (VA) mode liquid crystal display (LCD) device is a type of wide viewing angle technology. Since such VA mode LCD device displays black when no voltage is applied, and thus also is termed as normally black mode LCD device. However, such VA mode LCD device suffers from color washout at large viewing angle.

In order to solve the issue of color washout associated with the VA mode LCD device, the prior art has proposed a solution which uses two gate lines to control the charging order of two sub-pixels, one sub-pixel suffers from once feed through voltage drop, but the other one sub-pixel is controlled by the two gate lines and thus suffers from twice feed through voltage drop. As a result, the two sub-pixels would have different feed through voltages, which would easily result in signal error so that the display quality is degraded.

SUMMARY OF THE INVENTION

The present invention is directed to a liquid crystal display device, so as to effectively overcome the drawback in the prior art.

In order to achieve the above-mentioned objective, or to achieve other objectives, a liquid crystal display device in accordance with an embodiment of the present invention is provided. The liquid crystal display device includes a data line, a pixel, a first gate line, a second gate line, an additional electrode and an additional gate line. The pixel includes a first sub-pixel and a second sub-pixel. The first gate line is electrically coupled to the first sub-pixel. The second gate line is electrically coupled to the second sub-pixel. The first sub-pixel is electrically coupled to the data line to receive a signal provided from the data line. The second sub-pixel is electrically coupled to the first sub-pixel through the additional electrode and to receive a signal provided from the data line through the first sub-pixel. The additional gate line is arranged crossing over the additional electrode and whereby a compensation capacitance is formed between the additional gate line and the additional electrode.

In one embodiment, the additional electrode is electrically coupled between the first source/drain electrode of a first transistor of the first sub-pixel and the second source/drain electrode of a second transistor of the second sub-pixel.

In one embodiment, the first sub-pixel further includes a third transistor and a first display electrode electrically coupled to the first source/drain electrode of the third transistor, the second source/drain electrodes of the third and first transistors are electrically coupled to the data line, the gate electrodes of the third and first transistors are electrically coupled to the first gate line. The second sub-pixel further includes a second display electrode, the first source/drain electrode of the second transistor is electrically coupled with the second display electrode, and the gate electrode of the second transistor is electrically coupled to the second gate line. Furthermore, a parasitic capacitance between the gate electrode and the first source/drain electrode of the first transistor is preferably designed to be equal to the compensation capacitance, a parasitic capacitance between the gate electrode and the first source/drain electrode of the second transistor is preferably designed to be equal to another parasitic capacitance between the gate electrode and the first source/drain electrode of the third transistor.

In an alternative embodiment, the first sub-pixel further includes a first display electrode electrically coupled to the first source/drain electrode of the first transistor, the second source/drain electrode of the first transistor is electrically coupled to the data line, and the gate electrode of the first transistor is electrically coupled to the first gate line. The second sub-pixel further includes a second display electrode, the first source/drain electrode of the second transistor is electrically coupled with the second display electrode, and the gate electrode of the second transistor is electrically coupled to the second gate line. Furthermore, a parasitic capacitance between the gate electrode and the first source/drain electrode of the first transistor and another parasitic capacitance between the gate electrode and the first source/drain electrode of the second transistor both are preferably designed to be equal to the compensation capacitance.

In one embodiment, the additional gate line is arranged between the first sub-pixel and the second sub-pixel.

In order to achieve the above-mentioned objective, or to achieve other objectives, a liquid crystal display device in accordance with another embodiment of the present invention is provided. The liquid crystal display device includes a data line, a first pixel and a second pixel adjacent with each other, an additional electrode, a first gate line, a second gate line and an additional gate line. The first pixel includes a first display electrode and at least a first transistor, the first display electrode is electrically coupled to a first source/drain electrode of the at least a first transistor, and the second source/drain electrode of the at least a first transistor is electrically coupled to the data line. The second pixel includes a second display electrode and a second transistor, and the second display electrode is electrically coupled with the first source/drain electrode of the second transistor. The additional electrode is electrically coupled between a first source/drain electrode of the at least a first transistor and the second source/drain electrode of the second transistor. The first gate line is electrically coupled to the at least a first transistor of the first pixel to allow the first display electrode to receive a signal provided from the data line. The second gate line is electrically coupled to the second transistor of the second pixel to allow the second display electrode to receive a signal provided from the data line through the second transistor and the additional electrode. The additional gate line is arranged between the first pixel and the second pixel and crossing over the additional electrode to form capacitive coupling between the additional gate line and the additional electrode.

In order to achieve the above-mentioned objective, or to achieve other objectives, a liquid crystal display device in accordance with still another embodiment of the present invention is provided. The liquid crystal display device includes a data line, a first pixel and a second pixel adjacent with each other, a first gate line, a third gate line, a second gate line, an additional electrode and an additional gate line. Each of the first pixel and the second pixel includes a first sub-pixel and a second sub-pixel. The first gate line is electrically coupled to the first sub-pixel of the first pixel. The third gate line is electrically coupled to the second sub-pixel of the second pixel. The second gate line is arranged between the first gate line and the third gate line and electrically coupled to both the second sub-pixel of the first pixel and the first sub-pixel of the second pixel. A first one of the first sub-pixel and the second sub-pixel of the first pixel is electrically coupled to the data line to receive a signal provided from the data line. A second one of the first sub-pixel and the second sub-pixel of the first pixel is electrically coupled to the first one through the additional electrode and to receive a signal provided from the data line through the first one. The additional gate line is arranged crossing over the additional electrode to form capacitive coupling with the additional electrode. The additional gate line is electrically coupled to the third gate line.

In the above-mentioned embodiments of the present invention, an additional gate line is added between two sub-pixels within a pixel, the additional gate line can be designed to electrically couple to a gate line associated with next pixel and form a compensation capacitance together with an additional electrode arranged between the two sub-pixels within pixel. Therefore, the two sub-pixels each only suffer from once feed through voltage drop so that the two sub-pixels would have the same feed through voltages. As a result, the drawback in the prior art is effectively overcome.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
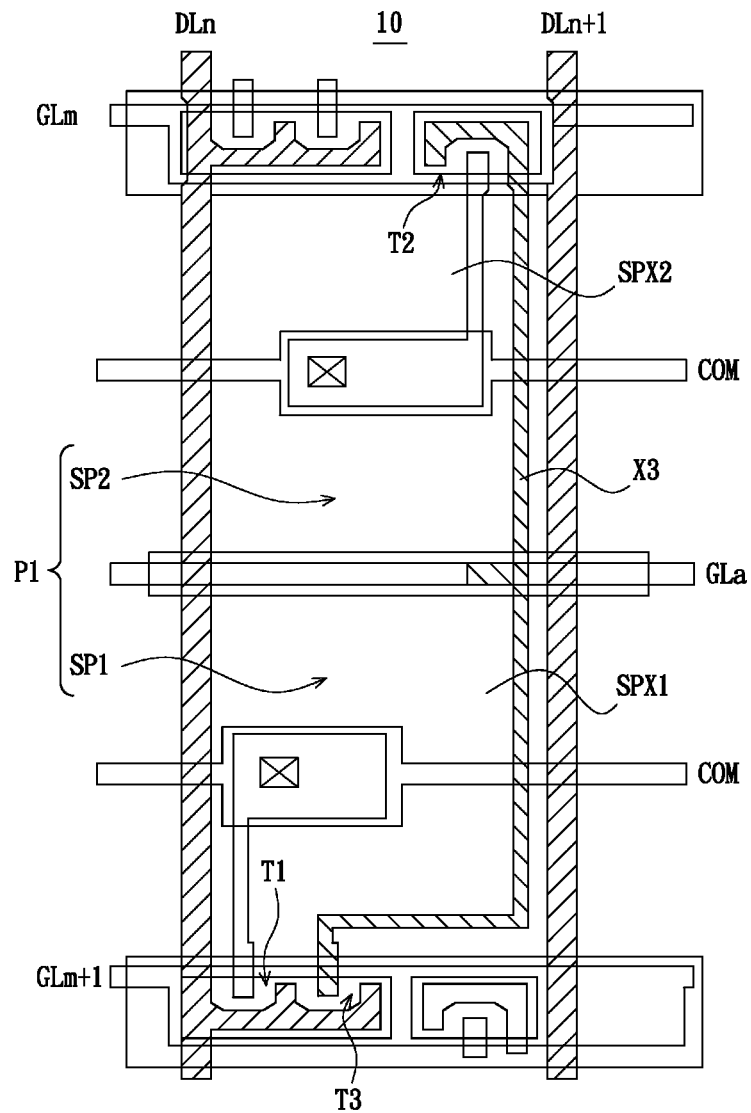
FIG. 1 is a schematic, partial circuit layout diagram of a liquid crystal display device in accordance with an embodiment of the present invention.
Figure 2:
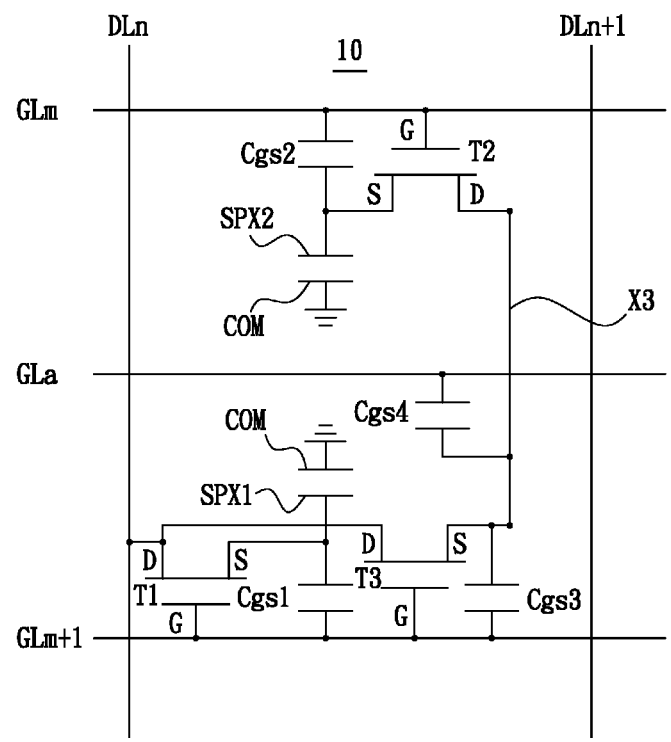
FIG. 2 is an equivalent circuit diagram of the liquid crystal display device in FIG. 1.

Referring to FIGS. 1 and 2, FIG. 1 showing a schematic partial circuit layout diagram of a liquid crystal display device 10 in accordance with an embodiment of the present invention, and FIG. 2 showing an equivalent circuit diagram of the liquid crystal display device 10 in FIG. 1. The liquid crystal display device 10 includes gate lines GLm, GLm+1, data lines DLn, DLn+1, an additional gate line GLa, an additional electrode X3, a common electrode COM and a pixel P1. The pixel P1 includes sub-pixels SP1 and SP2. The gate lines GLm, GLm+1 are respectively electrically coupled to the sub-pixels SP2, SP1 of the pixel P1 so as to supply gate driving signals for deciding whether to enable the sub-pixels SP2, SP1 of the pixel P1. The sub-pixel SP1 is electrically coupled to the data line DLn to receive a signal provided from the data line DLn. The sub-pixel SP2 is electrically coupled to the sub-pixel SP1 through the additional electrode X3 and to receive a signal provided from the data line DLn through the sub-pixel SP1. The additional gate line GLa is arranged crossing over the additional electrode X3 to form capacitive coupling with the additional electrode X3.

More specifically, referring to FIGS. 1 and 2 together, the sub-pixel SP1 includes transistors T1, T3 and a display electrode SPX1. The gate electrode G of the transistor T1 is electrically coupled to the gate line GLm+1, the drain electrode D of the transistor T1 is electrically coupled to the data line DLn, and the source electrode S of the transistor T1 is electrically coupled with the display electrode SPX1. The gate electrode G and the source electrode S of the transistor T1 have a parasitic capacitance Cgs1 formed therebetween. The gate electrode G of the transistor T3 is electrically coupled to the gate line GLm+1, the drain electrode D of the transistor T3 is electrically coupled to the data line DLn. The gate electrode G and the source electrode S of the transistor T3 have a parasitic capacitance Cgs3 formed therebetween. The display electrode SPX1 functions as a pixel electrode of the sub-pixel SP1, and the common electrode COM functions as another pixel electrode of the sub-pixel SP1. When the gate line GLm+1 enables the transistors T1, T3 of the sub-pixel SP1, the display electrode SPX1 is allowed to receive a signal provided from the data line DLn. The sub-pixel SP2 includes a transistor T2 and a display electrode SPX2. The gate electrode G of the transistor T2 is electrically coupled to the gate line GLm, the source electrode S of the transistor T2 is electrically coupled with the display electrode SPX2, and the drain electrode D of the transistor T2 is electrically coupled to the source electrode S of the transistor T3 of the sub-pixel SP1 through the additional electrode X3. The gate electrode G and the source electrode S of the transistor T2 have a parasitic capacitance Cgs2 formed therebetween. The display electrode SPX2 functions as a pixel electrode of the sub-pixel SP2, and the common electrode COM functions as another pixel electrode of the sub-pixel SP2. When the gate line GLm enables the transistor T2 of the sub-pixel SP2, the display electrode SPX2 is allowed to receive a signal provided from the data line DLn through the transistor T2 and the additional electrode X3. In the illustrated embodiment, the additional gate line GLa is arranged between the sub-pixel SP1 and the sub-pixel SP2, and further the additional gate line GLa and the additional electrode X3 have a compensation capacitance Cgs4 formed therebetween resulting from the capacitive coupling.

Figure 3:
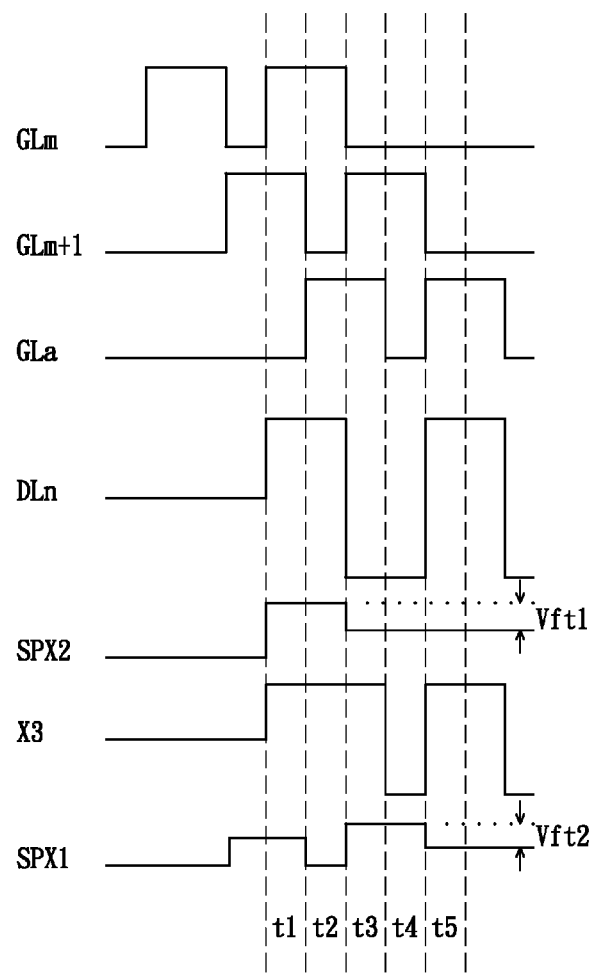
FIG. 3 shows timing diagrams of multiple signals of the liquid crystal display device in FIG. 1.

Referring to FIG. 3, showing timing diagrams of multiple signals of the liquid crystal display device 10 in FIG. 1. The liquid crystal display device 10 in accordance with the present embodiment how to achieve the same feed through voltages for the sub-pixels SP1 and SP2 within the pixel P1 will be described below in detail with reference to FIGS. 1 through 3.

As illustrated in FIG. 3, during t1 time interval, the gate lines GLm, GLm+1 both are enabled, the transistors T1, T2, T3 of the sub-pixels SP1, SP2 all are turned on, the data line DLn charges both the sub-pixels SP1, SP2. During t2 time interval, the gate line GLm+1 is disabled and the transistors T1, T3 of the sub-pixel SP1 are turned off correspondingly, the additional electrode X3 suffers from a feed through voltage drop resulting from the influence of disabling the gate line GLm+1 and the additional gate line GLa is enabled at the same time to compensate the feed through voltage drop caused by disabling the gate line GLm+1. As a result, the potentials of the sub-pixel SP2 and the additional electrode X3 after compensation are the same as the respective charged potentials thereof. Herein, the parasitic capacitance Cgs3 is preferably designed to be equal to the compensation capacitance Cgs4. During t3 time interval, the gate line GLm is disabled and the transistor T2 is turned off correspondingly, the sub-pixel SP2 would suffer from once feed through voltage drop Vft1. During t4 time interval, the data line DLn charges the sub-pixel SP1. During t5 time interval, the gate line GLm+1 is disabled and the transistor T1 is turned off correspondingly, the sub-pixel SP1 would suffer from once feed through voltage drop Vft2. Herein, when the parasitic capacitances Cgs1 and Cgs2 of the respective sub-pixels SP1 and SP2 are preferably designed to be equal to each other, the purpose of the feed through voltage drops Vft1 and Vft2 being the same can be achieved. Thus it will be seen that, in the present embodiment, by designing the parasitic capacitances Cgs3 and Cgs1 to be approximately equal to the compensation capacitance Cgs4 and the parasitic capacitance Cgs2 respectively, the purpose of the same feed through voltage drops for the two sub-pixels SP1, SP2 can be achieved.

Figure 4:
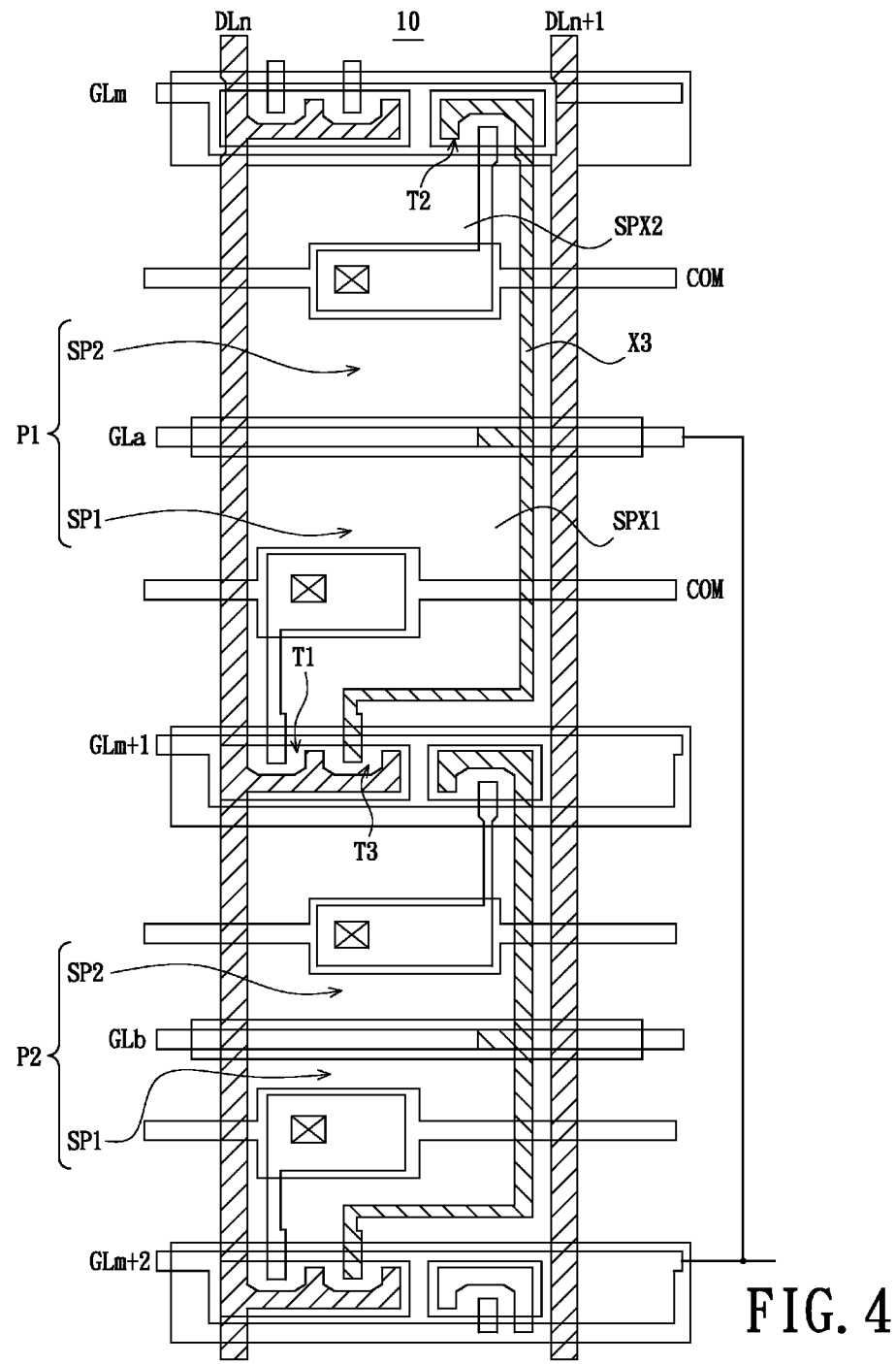
FIG. 4 is another schematic, partial circuit layout diagram of the liquid crystal display device in FIG. 1.

Referring to FIG. 4, showing another schematic partial circuit layout diagram of the liquid crystal display device 10. As seen from FIG. 4, the gate line GLm is electrically coupled to the sub-pixel SP2 of the pixel P1 so as to supply a gate driving signal for deciding whether to enable the sub-pixel SP2 of the pixel P1, the gate line GLm+1 is electrically coupled to the sub-pixel SP1 of the pixel P1 and the sub-pixel SP2 of the pixel P2 so as to supply a gate driving signal for deciding whether to enable the sub-pixel SP1 of the pixel P1 and the sub-pixel SP2 of the pixel P2, the gate line GLm+2 is electrically coupled to the sub-pixel SP1 of the pixel P2 so as to supply a gate driving signal for deciding whether to enable the sub-pixel SP1 of the pixel P2, and the gate line GLm+1 is arranged between the gate lines GLm and GLm+2. The sub-pixels SP1 and SP2 of the pixel P1 have an additional gate line GLa arranged therebetween, and the sub-pixels SP1 and SP2 of the pixel P2 have an additional gate line GLb arranged therebetween. The additional gate line GLa associated with the pixel P1 is electrically coupled to the gate line GLm+2 associated with the pixel P2. The pixel P2 and the pixel P1 are arranged adjacent with each other, and in the present embodiment, the pixel P2 and the pixel P1 have the same structural configuration. Herein, since the additional gate line GLa associated with the pixel P1 is electrically coupled to the gate line GLm+2 associated with the adjacent pixel SP2, the add of the additional gate lines GLa, GLb would not increase the amount of gate line of the liquid crystal display device 10.

Figure 5:
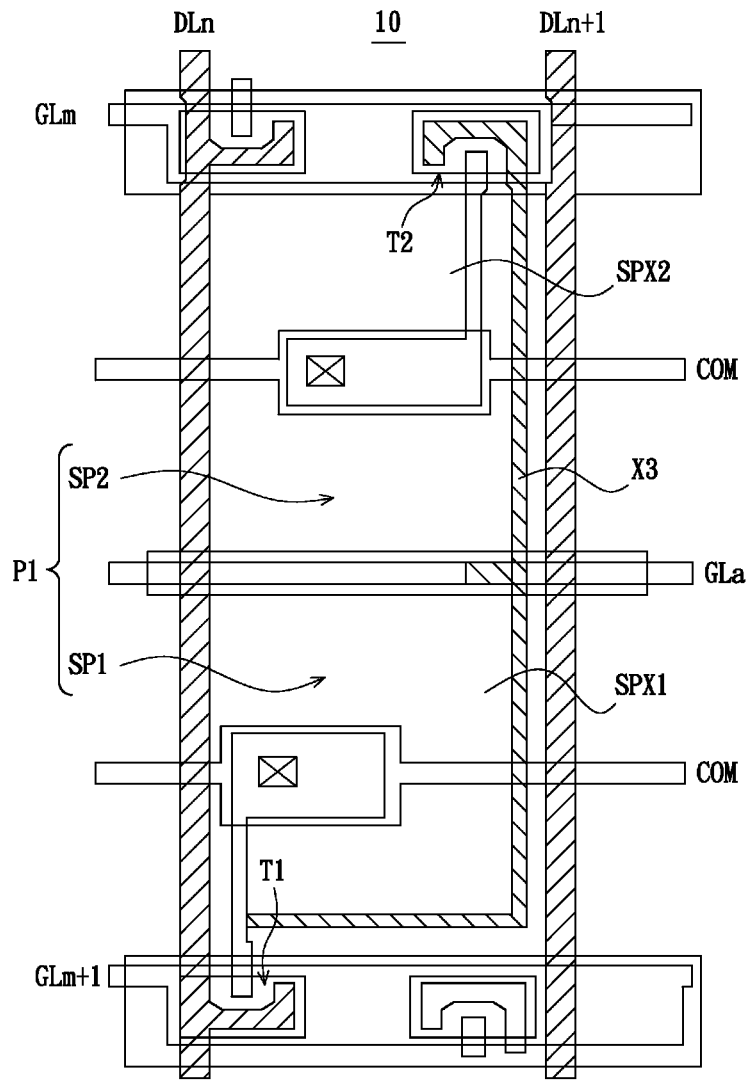
FIG. 5 shows another example of the liquid crystal display device in FIG. 1.
Figure 6:
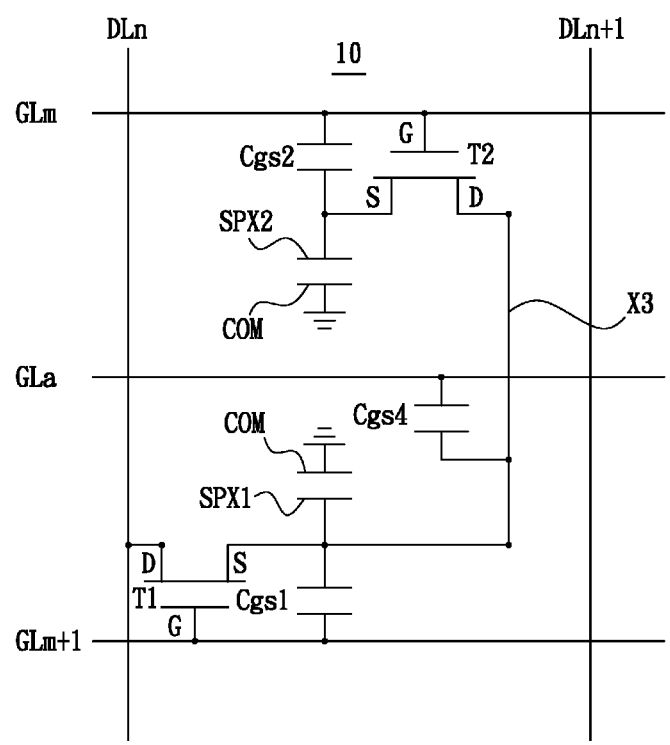
FIG. 6 is an equivalent circuit diagram of the liquid crystal display device in FIG. 5.

In addition, the sub-pixel SP1 of the pixel P1 of the liquid crystal display device 10 is not limited to include the two transistors T1 and T3, and can have other suitable modified designs. For example, as illustrated in FIGS. 5 and 6, the sub-pixel SP1 of the pixel P1 includes a single transistor T1, and correspondingly, the additional electrode X3 is modified to electrically couple between the drain electrode of the transistor T2 of the sub-pixel SP2 and the source electrode of the transistor T1 of the sub-pixel SP1. Moreover, in this situation, in order to achieve the purpose of the same feed through voltage drops for the two sub-pixels SP1, SP2, the parasitic capacitances Cgs1, Cgs2 both are preferably designed to be equal to the compensation capacitance Cgs4.

In summary, in the above-mentioned embodiments of the present invention, an additional gate line is added between two sub-pixels within a pixel, the additional gate line can be designed to electrically couple to a gate line associated with next pixel and form a compensation capacitance together with an additional electrode arranged between the two sub-pixels within pixel. Therefore, the two sub-pixels each only suffer from once feed through voltage drop so that the two sub-pixels would have the same feed through voltages. As a result, the drawback in the prior art is effectively overcome.

Additionally, the skilled person in the art can make some modifications with respect to the liquid crystal display device in accordance with the above-mentioned embodiments, for example, suitably changing the circuit layout of the liquid crystal display device, interchanging the connections of the source electrodes and the drain electrodes of the respective transistors, defining two sub-pixels within a single pixel as two pixels, as long as such modification(s) would not depart from the scope and spirit of the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A liquid crystal display device comprising:
   a data line;
   a first pixel and a second pixel adjacent with each other, wherein each of the first and second pixels comprises a first sub-pixel and a second sub-pixel;
   a first gate line electrically coupled to the first sub-pixel of the first pixel;
   a third gate line electrically coupled to the second sub-pixel of the second pixel;
   a second gate line arranged between the first gate line and the third gate line and electrically coupled to both the second sub-pixel of the first pixel and the first sub-pixel of the second pixel;
   an additional electrode; and
   an additional gate line;
   wherein a first one of the first and second sub-pixels of the first pixel is electrically coupled to the data line to receive a signal provided from the data line, a second one of the first and second sub-pixels of the first pixel is electrically coupled to the first one through the additional electrode and to receive a signal provided from the data line through the first one, the additional gate line is arranged crossing over the additional electrode to form capacitive coupling with the additional electrode, and the additional gate line is electrically coupled to the third gate line.

2. The liquid crystal display device as claimed in claim 1, wherein the additional electrode is electrically coupled between the first source/drain electrode of a first transistor of the first one and the second source/drain electrode of a second transistor of the second one.

3. The liquid crystal display device as claimed in claim 2, wherein
   the first one further comprises a third transistor and a first display electrode electrically coupled to the first source/drain electrode of the third transistor, the second source/drain electrodes of the third transistor and the first transistor are electrically coupled to the data line, and the gate electrodes of the third transistor and the first transistor are electrically coupled to a corresponding one of the first gate line and the second gate line; and
   the second one further comprises a second display electrode, the first source/drain electrode of the second transistor is electrically coupled with the second display electrode, and the gate electrode of the second transistor is electrically coupled to the other one of the first gate line and the second gate line.

4. The liquid crystal display device as claimed in claim 3, wherein a parasitic capacitance between the gate electrode and the first source/drain electrode of the first transistor is approximately equal to a capacitance formed between the additional gate line and the additional electrode resulting from the capacitive coupling, a parasitic capacitance between the gate electrode and the first source/drain electrode of the second transistor is approximately equal to another parasitic capacitance between the gate electrode and the first source/drain electrode of the third transistor.

5. The liquid crystal display device as claimed in claim 2, wherein
the first one further comprises a first display electrode electrically coupled with the first source/drain electrode of the first transistor, the second source/drain electrode of the first transistor is electrically coupled to the data line, and the gate electrode of the first transistor is electrically coupled to a corresponding one of the first gate line and the second gate line; and
the second one further comprises a second display electrode, the first source/drain electrode of the second transistor is electrically coupled with the second display electrode, and the gate electrode of the second transistor is electrically coupled to the other one of the first gate line and the second gate line.

6. The liquid crystal display device as claimed in claim 5, wherein a parasitic capacitance between the gate electrode and the first source/drain electrode of the first transistor and another parasitic capacitance between the gate electrode and the first source/drain electrode of the second transistor both are approximately equal to a capacitance formed between the additional gate line and the additional electrode resulting from the capacitive coupling.

7. The liquid crystal display device as claimed in claim 1, wherein the additional gate line is arranged between the first sub-pixel and the second sub-pixel of the first pixel.

* * * * *